US012648256B2

(12) United States Patent
Zhang et al.

(10) Patent No.: US 12,648,256 B2
(45) Date of Patent: Jun. 2, 2026

(54) SOLAR CELL AND PREPARATION METHOD THEREFOR

(71) Applicant: TONGWEI SOLAR (CHENGDU) CO., LTD., Chengdu (CN)

(72) Inventors: Peng Zhang, Chengdu (CN); Xiajie Meng, Chengdu (CN); Guoqiang Xing, Chengdu (CN)

(73) Assignee: TONGWEI SOLAR (CHENGDU) CO., LTD., Chengdu (CN)

( * ) Notice: Subject to any disclaimer, the term of this patent is extended or adjusted under 35 U.S.C. 154(b) by 0 days.

(21) Appl. No.: 18/869,882

(22) PCT Filed: Jun. 16, 2023

(86) PCT No.: PCT/CN2023/100575
§ 371 (c)(1),
(2) Date: Nov. 27, 2024

(87) PCT Pub. No.: WO2024/108989
PCT Pub. Date: May 30, 2024

(65) Prior Publication Data
US 2025/0351615 A1 Nov. 13, 2025

(30) Foreign Application Priority Data
Nov. 24, 2022 (CN) .......................... 202211479670.7

(51) Int. Cl.
*H10F 71/00* (2025.01)
*H10F 10/174* (2025.01)
(Continued)

(52) U.S. Cl.
CPC ......... *H10F 71/131* (2025.01); *H10F 10/174* (2025.01); *H10F 71/1221* (2025.01); *H10F 77/219* (2025.01); *H10F 77/707* (2025.01)

(58) Field of Classification Search
CPC .... H10F 71/131; H10F 77/707; H10F 10/174; H10F 77/219; H10F 71/1221
See application file for complete search history.

(56) References Cited

U.S. PATENT DOCUMENTS

| | | | |
|---|---|---|---|
| 9,082,908 B2 | 7/2015 | Chen et al. | |
| 2014/0065764 A1 | 3/2014 | Scardera et al. | |
| (Continued) | | | |

FOREIGN PATENT DOCUMENTS

| | | | |
|---|---|---|---|
| CN | 105609571 A | 5/2016 | |
| CN | 108649079 A | 10/2018 | |
| (Continued) | | | |

OTHER PUBLICATIONS

Machine translation of CN114335258A, Apr. 2022 (Year: 2022).*

(Continued)

*Primary Examiner* — Victor A Mandala
*Assistant Examiner* — Colleen E Snow
(74) *Attorney, Agent, or Firm* — Dority & Manning, PA

(57) ABSTRACT

In one aspect, a preparation method for a solar cell includes the following steps: sequentially forming a first silicon oxide layer, an intrinsic amorphous silicon layer, a phosphorosilicate glass layer and a second silicon oxide layer on the back surface of an n-type silicon substrate; removing the phosphorosilicate glass layer and the second silicon oxide layer in a partial region of the back surface of the n-type silicon substrate; subjecting the back surface of the n-type silicon substrate to boron diffusion; forming an isolation groove at the boundary between the boron-doped polycrystalline silicon layer and the phosphorus-doped polycrystalline silicon layer; and preparing a first electrode connected to the boron-doped polycrystalline silicon layer and a second electrode connected to the phosphorus-doped polycrystalline silicon layer.

15 Claims, 6 Drawing Sheets

(51) Int. Cl.
    *H10F 77/20*     (2025.01)
    *H10F 77/70*     (2025.01)

(56)         References Cited

U.S. PATENT DOCUMENTS

| | | | |
|---|---|---|---|
| 2021/0280726 A1 | 9/2021 | Rim et al. | |
| 2022/0262967 A1 | 8/2022 | Kim et al. | |
| 2024/0274745 A1* | 8/2024 | Liu | H10F 10/14 |
| 2024/0395963 A1* | 11/2024 | Xu | H10F 71/131 |

FOREIGN PATENT DOCUMENTS

| | | | |
|---|---|---|---|
| CN | 111628047 A | 9/2020 |
| CN | 113921626 A | 1/2022 |
| CN | 114335258 A | 4/2022 |
| CN | 114430000 A | 5/2022 |
| CN | 114664969 A | 6/2022 |
| CN | 112736163 B | 7/2022 |
| CN | 114695594 A | 7/2022 |
| CN | 114843368 A | 8/2022 |
| CN | 115332366 A | 11/2022 |
| CN | 115692548 A | 2/2023 |
| WO | WO 2015/183703 A1 | 12/2015 |

OTHER PUBLICATIONS

Chinese Notice of Grant of Invention Patent Rights for corresponding Application No. CN202211479670.7, dated Sep. 10, 2024, 4 pages.

PCT International Search Report and Written Opinion (w/ English translations) for corresponding Application No. PCT/CN2023/100575, mailed Sep. 22, 2023, 12 pages.

Chinese 1st Office Action for corresponding Application No. CN202211479670.7, dated Jun. 12, 2024, 7 pages.

Extended European Search Report received in corresponding Application No. EP 23893089.5 dated Aug. 26, 2025, 11 pages.

Notice of Acceptance received in corresponding Application No. AU 2023386275, dated Dec. 9, 2025, 4 pages.

\* cited by examiner

SOLAR CELL AND PREPARATION METHOD THEREFOR

This application is a U.S. National Stage of PCT International Application No. PCT/CN2023/100575 filed on Jun. 16, 2023, which claims priority to Chinese Patent Application No. 2022114796707, filed on Nov. 24, 2022, entitled "SOLAR CELL AND PREPARATION METHOD THEREFOR", the content of each of which is hereby incorporated by reference in its entirety.

TECHNICAL FIELD

The present application relates to the technical field of solar cell production, and in particular to a solar cell and a method for preparing the same.

BACKGROUND

N-type single crystal interdigitated back contact (IBC) solar cells usually form a heavily-doped emitter and a heavily-doped back field region on a back surface of its silicon wafer using a diffusion process, thereby effectively solving the problem of light blocking by metal grid lines and thus significantly increasing short-circuit current density.

Compared with conventional crystalline silicon solar cells, the N-type single crystal IBC solar cells possess the following advantages in actual outdoor photovoltaic power stations and system applications: 1. high photoelectric conversion efficiency; 2. no light-induced degradation (LID) and high stability; 3. good weak light response and low temperature coefficient; 4. a beautiful appearance, no grid line blocking on the front surface, being more beautiful than appearance of conventional components, and can being widely used in photovoltaic building integration; and 5. long service life.

However, the process for preparing the N-type single crystal IBC solar cell is relatively complex, with high technical barrier and high preparation cost, and thus is an important factor restricting the mass production of N-type single crystal IBC solar cells. Therefore, how to simplify the process for preparing the N-type single crystal IBC solar cell and reduce the preparation cost is an important research direction in this field.

SUMMARY

Accordingly, it is necessary to provide a solar cell and a method for preparing the same, in which the preparation method is relatively simple and has a low production cost.

According to an aspect of the present application, a method for preparing a solar cell is provided. The method includes the following steps:

forming a first silicon oxide layer, an intrinsic amorphous silicon layer, a phosphosilicate glass layer and a second silicon oxide layer sequentially on a back surface of an n-type silicon substrate;

removing the phosphosilicate glass layer and the second silicon oxide layer on a partial region of the back surface of the n-type silicon substrate;

performing boron diffusion on the back surface of the n-type silicon substrate, so that the intrinsic amorphous silicon layer in a region where the phosphosilicate glass layer and the second silicon oxide layer are removed is converted into a boron-doped polysilicon layer, and the intrinsic amorphous silicon layer in a region where the phosphosilicate glass layer and the second silicon oxide layer are not removed is converted into a phosphorus-doped polysilicon layer;

forming an isolation groove at a boundary between the boron-doped polysilicon layer and the phosphorus-doped polysilicon layer; and preparing a first electrode connected to the boron-doped polysilicon layer and a second electrode connected to the phosphorus-doped polysilicon layer.

In any embodiment, performing boron diffusion on the back surface of the n-type silicon substrate includes the following step:

performing a diffusion treatment on the back surface of the n-type silicon substrate using a boron source at a temperature ranging from 900° C. to 1050° C. for 1 h to 3 h.

In any embodiment, the boron source is one or more selected from $BCl_3$ or $BBr_3$.

In any embodiment, a volume proportion of the boron source in an atmosphere during the boron diffusion is 5% to 30%.

In any embodiment, removing the phosphosilicate glass layer and the second silicon oxide layer in the partial region of the back surface of the n-type silicon substrate includes the following steps:

forming a patterned blocking layer in a partial region of a surface of the second silicon oxide layer;

removing the phosphorosilicate glass layer and the second silicon oxide layer with a solution containing hydrogen fluoride in a region of the back surface of the n-type silicon substrate where the patterned blocking layer is not formed; and removing the patterned blocking layer.

In any embodiment, the patterned blocking layer is a waxy resin material.

In any embodiment, the patterned blocking layer is removed with an alkali solution containing hydrogen peroxide.

In any embodiment, forming the isolation groove at the boundary between the boron-doped polysilicon layer and the phosphorus-doped polysilicon layer includes the following step:

performing laser grooving at the boundary between the boron-doped polysilicon layer and the phosphorus-doped polysilicon layer, and etching a laser-formed groove with an alkali solution.

In any embodiment, after forming the isolation groove and prior to preparing the first electrode and the second electrode, the method further includes a step of removing a wrap-around layer on a front surface of the n-type silicon substrate.

In any embodiment, after forming the isolation groove and prior to removing the wrap-around layer on the front surface of the n-type silicon substrate, the method further includes a step of forming a third silicon oxide layer in the isolation groove.

In any embodiment, after removing the wrap-around layer on the front surface of the n-type silicon substrate and prior to preparing the first electrode and the second electrode, the method further includes a step of performing a texturing process on the front surface of the n-type silicon substrate and cleaning the n-type silicon substrate with a mixed solution of hydrofluoric acid and hydrochloric acid.

In any embodiment, after cleaning the n-type silicon substrate and prior to preparing the first electrode and the second electrode, the method further includes a step of forming aluminum oxide layers on the front surface and the back surface of the n-type silicon substrate, respectively.

In any embodiment, after forming the aluminum oxide layer and prior to preparing the first electrode and the second electrode, the method further includes a step of forming passivation and anti-reflection layers on the aluminum oxide layers on the front surface and the back surface of the n-type silicon substrate respectively.

In any embodiment, after forming the passivation and anti-reflection layer and prior to preparing the first electrode and the second electrode, the method further includes forming openings in the passivation and anti-reflection layer on the back surface of the n-type silicon substrate to form a first electrode contact hole which is communicated with the boron-doped polysilicon layer and a second electrode contact hole which is communicated with the phosphorus-doped polysilicon layer.

In any embodiment, the first electrode is prepared in the first electrode contact hole by screen printing; and the second electrode is prepared in the second electrode contact hole by screen printing.

According to another aspect of the present application, a solar cell is provided. The solar cell is prepared by the method for preparing the solar cell in the present application described above.

According to another aspect of the present application, a solar cell is provided. The solar cell includes an n-type silicon substrate, a first silicon oxide layer, a boron-doped polysilicon layer, a phosphorus-doped polysilicon layer, an aluminum oxide layer, a passivation and anti-reflection layer, a first electrode, and a second electrode. The first silicon oxide layer is disposed on a back surface of the n-type silicon substrate. The boron-doped polysilicon layer is disposed on the first silicon oxide layer. The phosphorus-doped polysilicon layer is disposed on the first silicon oxide layer and is separated from the boron-doped polysilicon layer by an isolation groove. The aluminum oxide layer is disposed on a front surface of the n-type silicon substrate, on the boron-doped polysilicon layer, on the phosphorus-doped polysilicon layer and in the isolation groove. The passivation and anti-reflection layer is disposed on the aluminum oxide layer. The first electrode extends through the passivation and anti-reflection layer and the aluminum oxide layer on the back surface of the n-type silicon substrate and is connected to the boron-doped polysilicon layer. The second electrode extends through the passivation and anti-reflection layer and the aluminum oxide layer on the back surface of the n-type silicon substrate and is connected to the phosphorus-doped polysilicon layer.

According to the preparation method of the present application, through removing the phosphosilicate glass layer and the second silicon oxide layer in the partial region of the back surface of the n-type silicon substrate and then performing the boron diffusion, the boron-doped polysilicon layer and the phosphorus-doped polysilicon layer are formed in one step on the back surface of the n-type silicon substrate. The preparation method can simultaneously prepare the boron-doped polysilicon layer and the phosphorus-doped polysilicon layer through only a single high-temperature process (i.e., boron diffusion), thereby greatly simplifying the preparation process for the solar cell and reducing production cost.

BRIEF DESCRIPTION OF THE DRAWINGS

In order to better describe and illustrate embodiments and/or examples of the present application, reference may be made to one or more of the drawings. The additional details or examples used to describe the drawings should not be considered limiting of the scope of any one of the disclosed applications, the presently described embodiments and/or examples, and the best mode presently understood of these applications.

Figure 1:
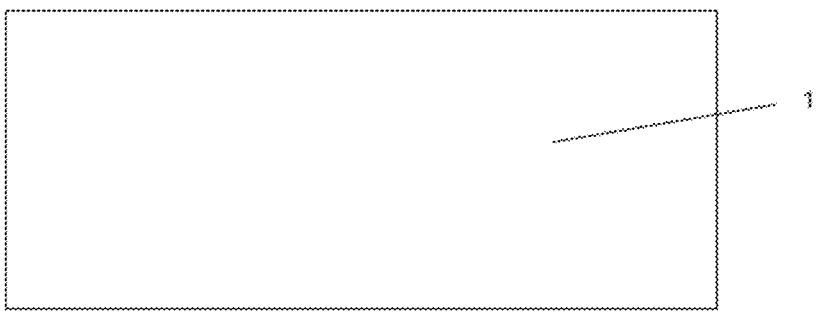
FIG. 1 is a schematic view of an n-type silicon substrate.

DESCRIPTION OF REFERENCE SIGNS 1. n-type silicon substrate; 2. first silicon oxide layer; 3. intrinsic amorphous silicon layer; 4. phosphosilicate glass layer; 5. second silicon oxide layer; 6. patterned blocking layer; 7. boron-doped polysilicon layer; 8. borosilicate glass; 9. phosphorus-doped polysilicon layer; 10. isolation groove; 11. wrap-around layer; 12. aluminum oxide layer; 13. passivation and anti-reflection layer; 14. first electrode; 15. second electrode; 100. solar cell.

DETAILED DESCRIPTION

In order to make the present application more comprehensible, the present application is described in detail below with reference to the accompanying drawings. In the drawings, better embodiments of the present application are given. However, the present application can be implemented in many different forms and is not limited to the embodiments described herein. It should be understood that these embodiments are provided for the purpose of providing a more thorough understanding of the disclosure of the present application.

In addition, the terms "first" and "second" are only used for descriptive purposes and cannot be understood as indicating or implying relative importance or implicitly indicating the quantity or order of the indicated technical features. Therefore, the features modified by "first" or "second" may explicitly or implicitly include at least one of the features. In the description of the present application, the "plurality" means at least two, such as two, three, etc., unless otherwise specifically defined.

In describing positional relationships, unless otherwise specified, when an element such as a layer, a film, or a substrate is referred to as being "on" another film layer, it can be directly on the other film layer, or an intervening film layer may also be present. Further, when a layer is referred to as being 'below' another layer, it can be directly below the other film layer, or one or more intervening layers may be present. It will also be understood that when a layer is referred to as being "between" two layers, it can be the only layer between the two layers, or one or more intervening layers may also be present.

Unless mentioned to the contrary, terms in a singular form may include a plural form and should not be construed as being one in number.

Unless otherwise defined, all technical and scientific terms used herein have the same meaning as commonly understood by those of ordinary skill in the art to which the present application pertains. The terms used in the specification of the present application herein are for the purpose of describing embodiments only and are not intended to limit the present application.

Referring to FIG. 1 to FIG. 13, an embodiment of the present application provides a method for preparing a solar cell 100, and the method includes the following step S1 to step S14.

Step S1: an n-type silicon substrate 1 is provided, a damage removal treatment is then performed on the n-type silicon substrate 1 using an alkaline solution, and then a cleaning treatment is performed. The structure of the n-type silicon substrate 1 is shown in FIG. 1.

In some embodiments, the n-type silicon substrate 1 is subjected to a damage removal treatment using a sodium hydroxide solution to remove a damaged layer on the surface of the n-type silicon substrate 1 after mechanical processing, and then the surface of the n-type silicon substrate 1 is cleaned by water washing.

Figure 2:
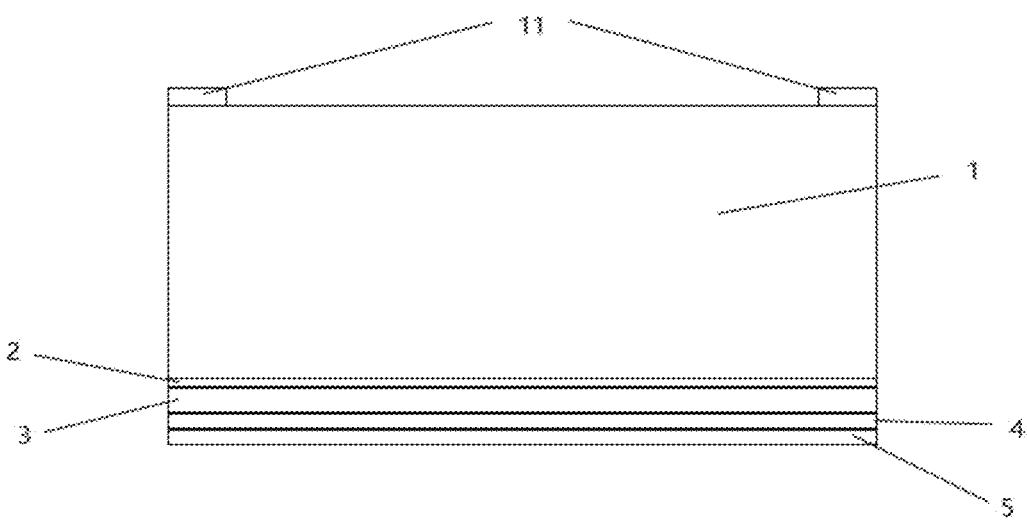
FIG. 2 is a schematic view after forming a first silicon oxide layer, an intrinsic amorphous silicon layer, a phossilicate glass layer, and a second silicon oxide layer on a back surface of the n-type silicon substrate.

Step S2: a first silicon oxide layer 2, an intrinsic amorphous silicon layer 3, a phosphosilicate glass layer 4, and a second silicon oxide layer 5 are sequentially formed on a back surface of the n-type silicon substrate 1 (i.e., a lower surface of the n-type silicon substrate 1 in FIG. 1). The structure after forming the first silicon oxide layer 2. the intrinsic amorphous silicon layer 3, the phosphosilicate glass layer 4, and the second silicon oxide layer 5 is shown in FIG. 2.

In some embodiments, by using low pressure chemical vapor deposition (LPCVD) or plasma enhanced chemical vapor deposition (PECVD), the first silicon oxide layer 2 is firstly deposited on the back surface of the n-type silicon substrate 1, and then the intrinsic amorphous silicon layer 3 is deposited on the first silicon oxide layer 2. A thickness of the first silicon oxide layer 2 is 1 nm to 2 nm. A thickness of the intrinsic amorphous silicon layer 3 is 50 nm to 500 nm.

In some embodiments, the phosphosilicate glass layer 4 (PSG) and the second silicon oxide layer 5 are sequentially formed on the intrinsic amorphous silicon layer 3 by using atmospheric pressure chemical vapor deposition (APCVD). A thickness of the phosphosilicate glass layer 4 is 30 nm to 100 nm, and a mass percent of phosphorus (P) in the phosphosilicate glass layer 4 is less than or equal to 50%. A thickness of the second silicon oxide layer 5 is 30 nm to 100 nm.

Figure 3:
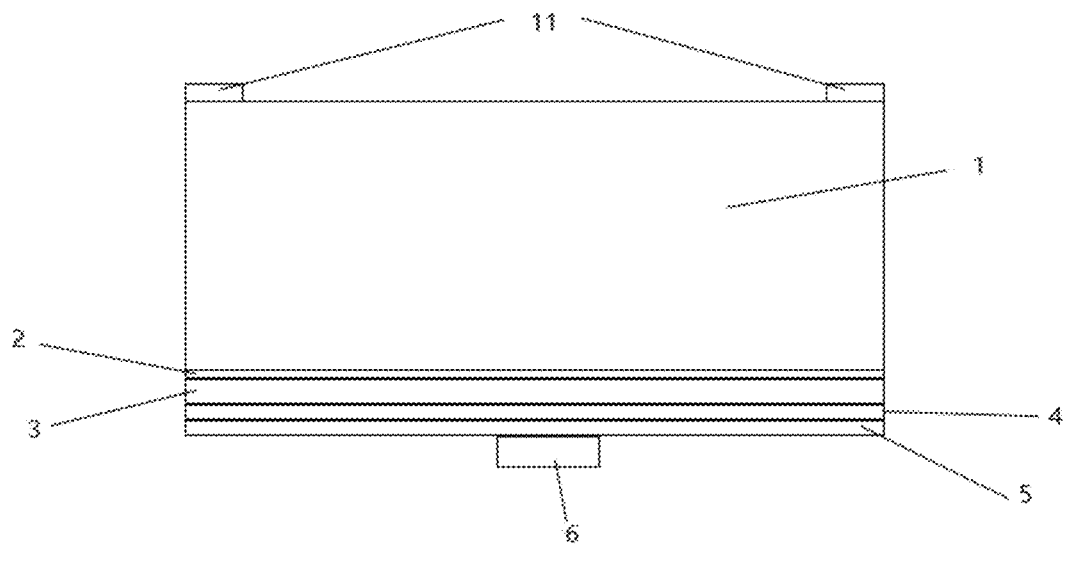
FIG. 3 is a schematic view after forming a patterned blocking layer in a partial region of the second silicon oxide layer.

Step S3: a patterned blocking layer 6 is formed in a partial region of a surface of the second silicon oxide layer 5. The structure after forming the patterned blocking layer 6 is shown in FIG. 3.

In some embodiments, a blocking layer slurry is pattenedly printed on the partial region of the surface of the second silicon oxide layer 5 according to a preset pattern, and then dried to form the above-mentioned patterned blocking layer 6. The blocking layer slurry has the following characteristics: the formed blocking layer can be dissolved in alkali but insoluble in acid.

In some embodiments, the patterned blocking layer 6 is a waxy resin material.

In some embodiments, the patterned blocking layer 6 formed after printing has printed lines with spacing ranging from 500 μm to 2000 μm.

Figure 4:
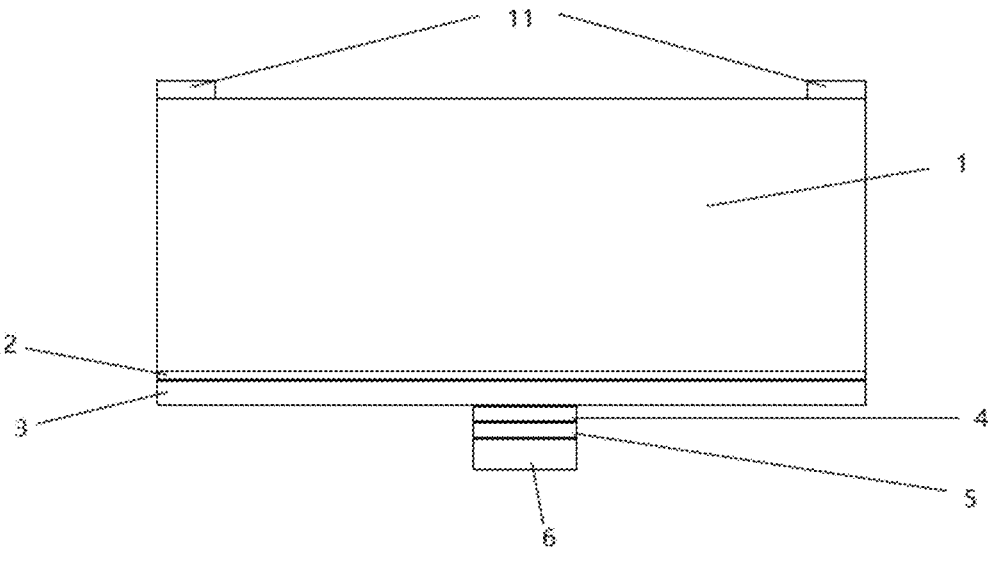
FIG. 4 is a schematic view after removing the phosphorosilicate glass layer and the second silicon oxide layer in a region where the patterned blocking layer is not formed.

Step S4: the phosphorosilicate glass layer 4 and the second silicon oxide layer 5 in a region of the back surface of the n-type silicon substrate 1 where the patterned blocking layer 6 is not formed are removed using a solution containing HF (i.e., hydrofluoric acid). The structure after removing the phosphosilicate glass layer 4 and the second silicon oxide layer 5 in the region where the blocking layer is not disposed is shown in FIG. 4.

In some embodiments, a hydrofluoric acid solution is used to remove the phosphosilicate glass layer 4 and the second silicon oxide layer 5 in the region where the patterned blocking layer 6 is not formed, and the first silicon oxide layer 2 is preserved. In the region of the back surface of the n-type silicon substrate I where the patterned blocking layer 6 is disposed, the phosphosilicate glass layer 4 and the second silicon oxide layer 5 on the inner side of the patterned blocking layer will not be removed due to the presence of the patterned blocking layer 6.

Figure 5:
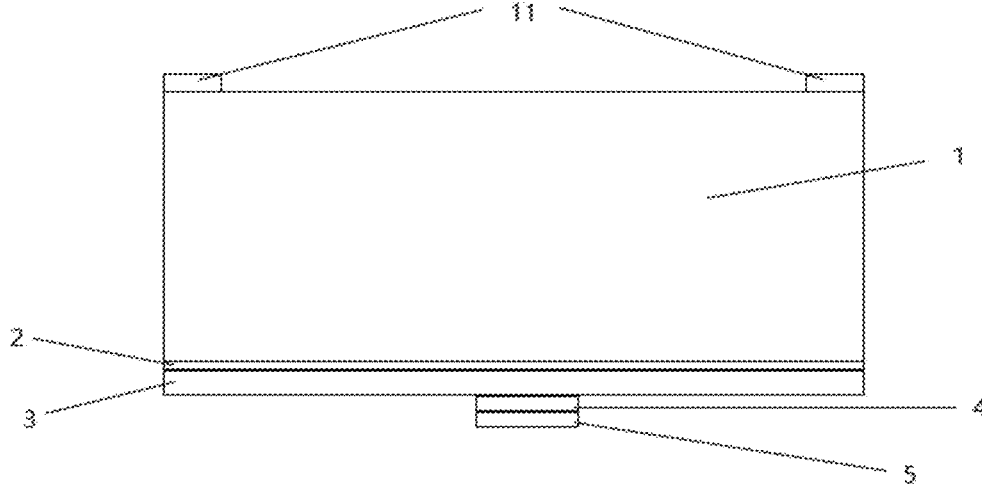
FIG. 5 is a schematic view after removing the patterned blocking layer.

Step S5: the patterned blocking layer 6 is removed. The structure after removing the patterned blocking layer 6 is shown in FIG. 5.

In some embodiments. a mixed solution of sodium hydroxide and hydrogen peroxide ($H_2O_2$) is used to remove the patterned blocking layer 6. After removing the patterned blocking layer 6, a mixed solution of hydrochloric acid (HCl) and $H_2O_2$ is used to clean the n-type silicon substrate 1.

After the patterned blocking layer 6 is removed, the phosphosilicate glass layer 4 and the second silicon oxide layer 5 at the position corresponding to the patterned blocking layer 6 are preserved.

It should be noted that the purpose of the above steps S3, S4 and S5 is to form a stacked structure including the phosphosilicate glass layer 4 and the second silicon oxide layer 5 on a partial region of the back surface of the n-type silicon substrate 1, while other regions of the back surface of the n-type silicon substrate I only include the first silicon oxide layer 2 and the intrinsic amorphous silicon layer 3. The steps S3 to S5 provide the patterned blocking layer 6 as a mask layer to achieve the above purpose. It should be understood that other methods can be used to achieve the above purpose in some other embodiments of the present application, as long as the stacked structure including the phosphosilicate glass layer 4 and the second silicon oxide layer 5 is formed on a partial region of the back surface of the n-type silicon substrate 1.

Figure 6:
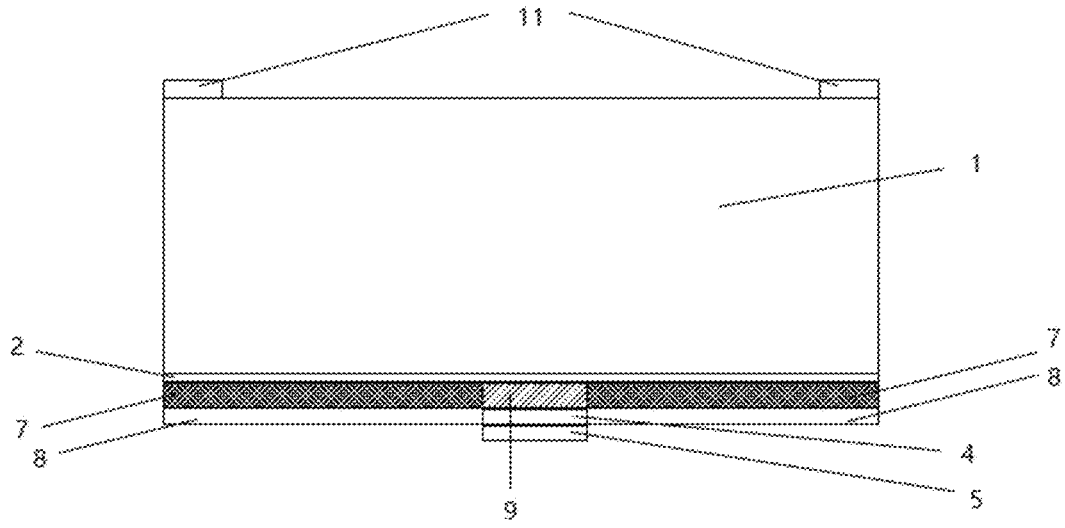
FIG. 6 is a schematic view after boron diffusion.

Step S6: boron diffusion is performed on the back surface of the n-type silicon substrate 1. The structure after the boron diffusion is shown in FIG. 6.

During the high-temperature treatment process of the boron diffusion, the intrinsic amorphous silicon layer 3 in the region of the back surface of the n-type silicon substrate 1 where the phosphosilicate glass layer 4 and the second silicon oxide layer 5 are removed can be converted into a boron-doped polysilicon layer 7, and borosilicate glass 8 (BSG) is formed on its outer layer due to the diffusion. In contrast, due to the action of the high temperature, the phosphorus in the phosphosilicate glass layer 4 is diffused into the intrinsic amorphous silicon layer 3 in the region of the back surface of the n-type silicon substrate 1 where the phosphosilicate glass layer 4 and the second silicon oxide layer 5 are not removed (i.e., a corresponding region where the patterned blocking layer 6 is provided), and a phosphorus-doped polysilicon layer 9 is formed through crystallization and annealing. Due to the blocking of the second silicon oxide layer 5 on the outside, boron will not be doped into the intrinsic amorphous silicon layer 3 in this region. As such, the preparation of the boron-doped polysilicon layer 7 and the phosphorus-doped polysilicon layer 9 can be achieved simultaneously through a one-step high-temperature process (i.e., boron diffusion), thereby greatly simplifying the preparation process of the solar cell 100 and reducing the production cost for the solar cell 100.

The region corresponding to the boron-doped polysilicon layer 7 is the p-region, and the region corresponding to the phosphorus-doped polysilicon layer 9 is the n-region.

In some embodiments, the n-type silicon substrate I is placed in a boron diffusion furnace. The boron diffusion is performed at a temperature ranging from 900° C. to 1050° C. for 1 h to 3 h by using a boron source such as boron trichloride ($BCl_3$) and/or boron tribromide ($BBr_3$). A volume proportion of the boron source in an atmosphere of the boron diffusion in the furnace is 5% to 30%. It should be understood that the temperature for boron diffusion can be but is not limited to 900° C. 920° C., 950° C. 980° C., 1000° C., 1020° C., 1050° C., etc. The time period of boron diffusion can be but is not limited to 1 h, 1.5 h, 2 h, 2.5 h, 3 h, etc. The volume proportion of the boron source in the atmosphere of the boron diffusion can be but is not limited to 5%, 8%, 10%, 12%, 15%, 18%, 20%, 22%, 25%, 28%, 30%, etc.

Figure 7:
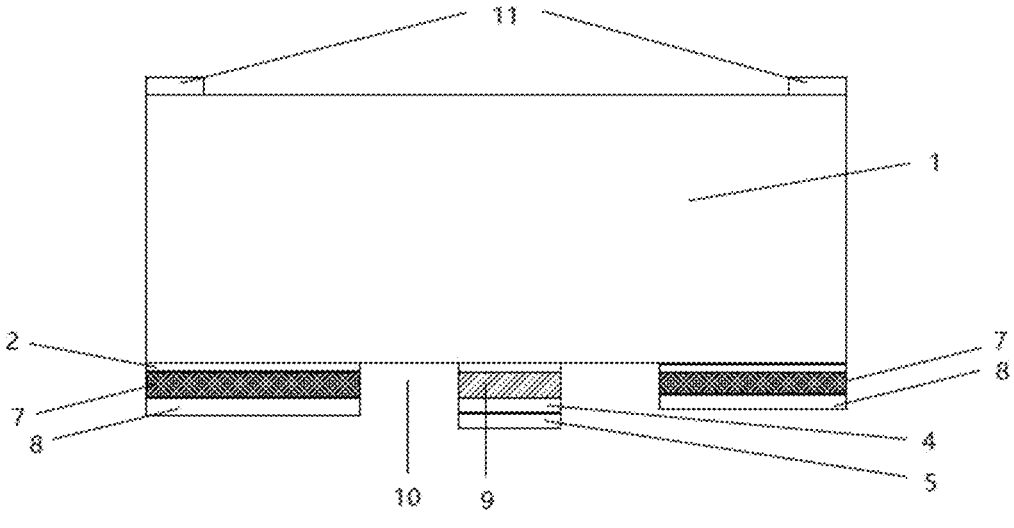
FIG. 7 is a schematic view after laser grooving to form an isolation groove.

Step S7: laser grooving is formed at the boundary between the boron-doped polysilicon layer and the phosphorus-doped polysilicon layer by using a laser, and then etching is performed using an alkali solution to form an isolation groove 10. The structure after laser grooving to form the isolation groove 10 is shown in FIG. 7.

In some embodiments, a laser is utilized to perform laser grooving at the boundary between the boron-doped polysilicon layer 7 and the phosphorus-doped polysilicon layer 9 to remove the polysilicon layer in the grooved region, and then an alkaline solution such as a sodium hydroxide solution is utilized to etch the grooved region, so that the boron-doped polysilicon layer 7 and the phosphorus-doped polysilicon layer 9 are separated and are not directly connected to each other.

Step S8: a wrap-around layer 11 on the front surface of the n-type silicon substrate 1 is removed.

Figure 8:
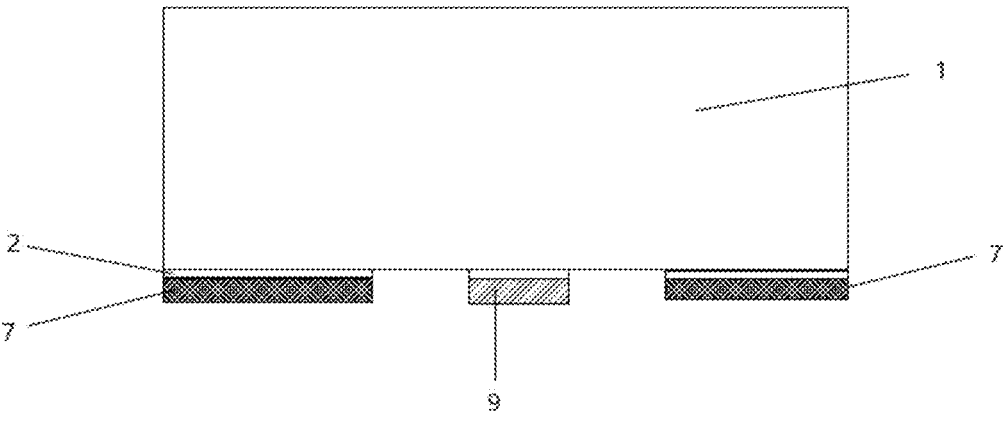
FIG. 8 is a schematic view after a chain acid polishing process.

In some embodiments, the wrap-around layer 11 on the front surface of the n-type silicon substrate 1 including the silicon oxide layer, phosphosilicate glass, the polysilicon layer and borosilicate glass that are wrapped around is removed using a chain acid polishing ($HF+HNO_3$) device. By using the chain acid polishing ($HF+HNO_3$) device, the silicon oxide layer, phosphosilicate glass, the polysilicon layer and borosilicate glass that are wrapped around on the front surface all can be removed at one time, thereby avoiding electric leakage and appearance defect for the solar cell 100 caused by incomplete removal of the wrap-around layer 11. While removing the wrap-around layer 11 on the front surface, the phosphosilicate glass layer 4, the second silicon oxide layer 5 and borosilicate glass 8 on the back surface of the n-type silicon substrate 1 are also removed. The schematic view after the chain acid polishing treatment is shown in FIG. 8.

In some embodiments. prior to removing the wrap-around layer 11 on the front surface of the n-type silicon substrate 1, a silicon oxide film is deposited in the isolation groove 10 through atmospheric pressure chemical vapor deposition (APCVD). Then, the n-type silicon substrate 1 is subjected to removal of wrap-around layer 11 in the chain acid polishing device. As such, the silicon oxide film can protect the isolation groove 10 region on the back surface of the n-type silicon substrate 1 from being textured in the subsequent texturing process, which maintains the surface morphology of this region and reduces the carrier recombination in this region, thereby improving the overall passivation performance of the back surface of the n-type silicon substrate 1.

Figure 9:
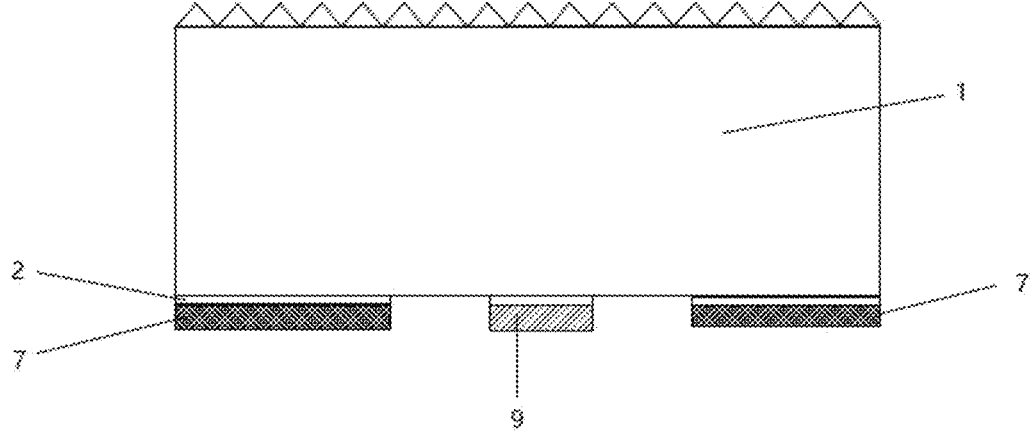
FIG. 9 is a schematic view after texturing and cleaning processes.

Step S9: a texturing process and then cleaning are performed on the front surface of the n-type silicon substrate. The structure after texturing and cleaning is shown in FIG. 9.

In some embodiments, the n-type silicon substrate 1 is placed in a slot cleaning machine, and a sodium hydroxide solution is utilized to texturize the front surface of the n-type silicon substrate 1. The back surface of the n-type silicon substrate 1 will not be etched by the alkaline solution (the texturing agent) due to the protection of phosphosilicate glass and borosilicate glass. When the texturing process is completed, a mixed solution of hydrofluoric acid and hydrochloric acid is utilized for cleaning.

Figure 10:
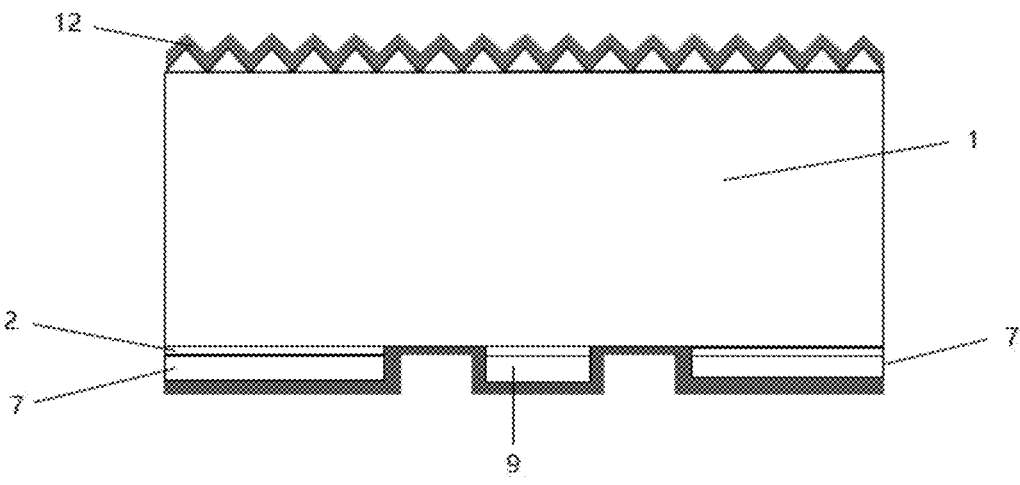
FIG. 10 is a schematic view after forming aluminum oxide layers on the front surface and the back surface of the n-type silicon substrate.

Step S10: aluminum oxide layers 12 are formed on the front surface and the back surface of the n-type silicon substrate 1, respectively. The structure after forming the aluminum oxide layer 12 is shown in FIG. 10.

In some embodiments, the aluminum oxide layers 12 are respectively formed on the front surface and the back surface of the n-type silicon substrate 1 through atomic layer deposition (ALD). The thickness of the aluminum oxide layers 12 on the front surface and the back surface of the n-type silicon substrate I is each independently 3 nm to 10 nm.

Figure 11:
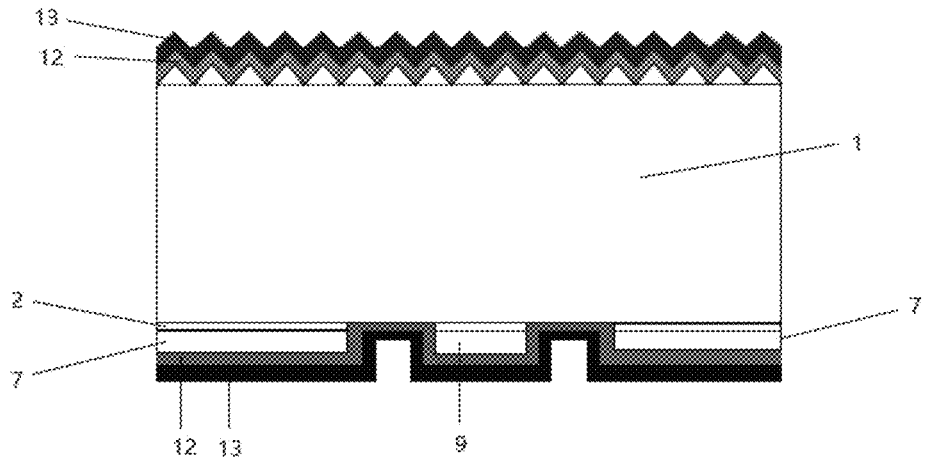
FIG. 11 is a schematic view after forming passivation and anti-reflection layers on the front surface and the back surface of the n-type silicon substrate.

Step S11: passivation and anti-reflection layers 13 are formed on the aluminum oxide layers 12 on the front surface and the back surface of the n-type silicon substrate 1, respectively. The structure after forming the passivation and anti-reflection layer 13 is shown in FIG. 11.

In some embodiments, a passivation and anti-reflection layer 13 with a thickness of 60 nm to 100 nm is first deposited on the aluminum oxide layer 12 on the front surface of the n-type silicon substrate 1 through PECVD, and then a passivation and anti-reflection layer 13 with a thickness of 80 nm to 150 nm is deposited on the aluminum oxide layer 12 on the back surface of the n-type silicon substrate 1 through PECVD.

Figure 12:
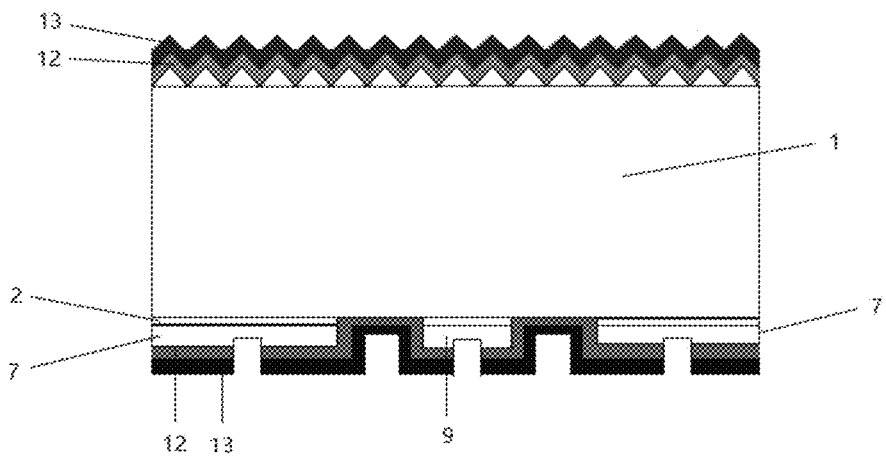
FIG. 12 is a schematic view after forming openings in the passivation and anti-reflection layer on the back surface of the n-type silicon substrate.

Step S12: openings are formed in the passivation and anti-reflection layer 13 on the back surface of the n-type silicon substrate 1. The structure after forming openings is shown in FIG. 12.

In some embodiments, a laser is utilized to form openings in the passivation and anti-reflection layer 13 on the back surface of the n-type silicon substrate 1, so as to form a first electrode contact bole which is in communication with the boron-doped polysilicon layer 7 and a second electrode contact hole which is in communication with the phosphorus-doped polysilicon layer 9, respectively. As such, electrodes connected to the boron-doped polysilicon layer 7 and the phosphorus-doped polysilicon layer 9 can be prepared in the first electrode contact hole and the second electrode contact hole, respectively.

Figure 13:
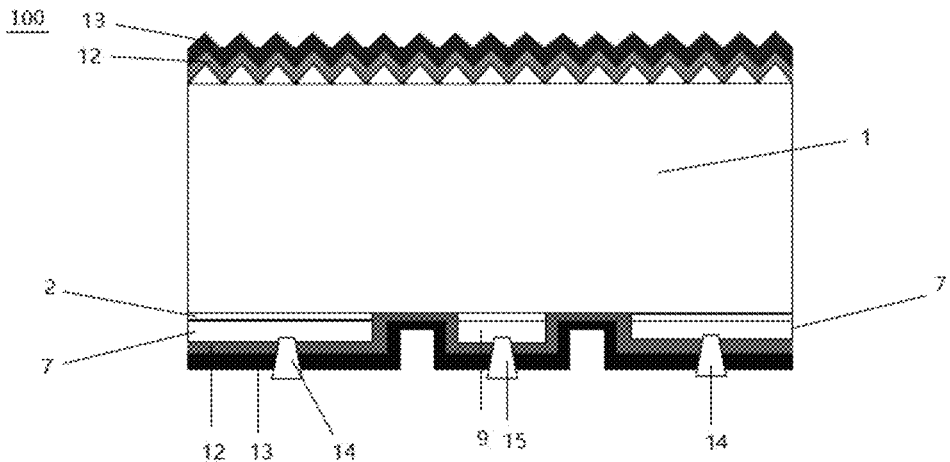
FIG. 13 is a schematic view of a solar cell according to an embodiment of the present application.

Step S13: a first electrode 14 and a second electrode 15 are prepared in the first electrode contact hole and the second electrode contact hole, respectively. The structure of the obtained solar cell 100 is shown in FIG. 13.

In some embodiments, the first electrode 14 is prepared in the first electrode contact hole by screen printing, and the first electrode 14 is connected to the boron-doped polysilicon layer 7. The second electrode 15 is prepared in the second electrode contact hole by screen printing, and the second electrode 15 is connected to the phosphorus-doped polysilicon layer 9.

Step S14: light is injected.

The prepared solar cell 100 is subjected to light injection by using a light injection device.

In general, according to the preparation method of the solar cell 100 in the present application, through removing the phosphosilicate glass layer 4 and the second silicon oxide layer 5 in the partial region of the back surface of the n-type silicon substrate 1 and then performing the boron diffusion, the boron-doped polysilicon layer 7 and the phosphorus-doped polysilicon layer 9 are formed in one step on the back surface of the n-type silicon substrate 1. The preparation method can simultaneously prepare the boron-doped polysilicon layer 7 and the phosphorus-doped polysilicon layer 9 through only a single high-temperature process (i.e., boron diffusion), thereby greatly simplifying the preparation process for the solar cell 100 and reducing production cost.

In addition, by forming a patterned blocking layer 6 in a partial region of the surface of the second silicon oxide layer 5 to pattern the back surface of the n-type silicon substrate 1, the phosphosilicate glass layer 4 and the second silicon oxide layer 5 in other region of the back surface of the n-type silicon substrate 1 can be easily removed, and the phosphosilicate glass layer 4 and the second silicon oxide layer 5 in the partial region are preserved. According to the preparation method of the solar cell 100 in the present application, the first silicon oxide layer 2 and the boron-doped polysilicon layer 7 are formed in the p-region of the back surface of the n-type silicon substrate 1, and the first silicon oxide layer 1 and the phosphorus-doped polysilicon layer 9 are formed in the n-region, which greatly improves the passivation performance of the solar cell 100, thereby facilitating to improve the open circuit voltage (Voc) of the solar cell 100.

Referring to FIG. 1 to FIG. 3, an embodiment of the present application provides a back-contact solar cell 100. The solar cell 100 includes an n-type silicon substrate 1, a first silicon oxide layer 2, a boron-doped polysilicon layer 7, a phosphorus-doped polysilicon layer 9, an aluminum oxide layer 12, a passivation and anti-reflection layer 13, a first electrode 14, and a second electrode 15.

The first silicon oxide layer 2 is disposed on the back surface of the n-type silicon substrate 1. The boron-doped polysilicon layer 7 is disposed on the first silicon oxide layer 2. The phosphorus-doped polysilicon layer 9 is disposed on the first silicon oxide layer 2 and is separated from the boron-doped polysilicon layer 7 by an isolation groove 10. Aluminum oxide layers 12 are disposed on the front surface of the n-type silicon substrate 1, on the boron-doped polysilicon layer 7, on the phosphorus-doped polysilicon layer 9 and in the isolation groove 10. Passivation and anti-reflection layers 13 are disposed on each of the aluminum oxide layers 12. The first electrode 14 extends through the passivation and anti-reflection layer 13 and the aluminum oxide layer 12 on the back surface of the n-type silicon substrate 1 and is connected to the boron-doped polysilicon layer 7. The second electrode 15 extends through the passivation and anti-reflection layer 13 and the aluminum oxide layer 12 on the back surface of the n-type silicon substrate 1 and is connected to the phosphorus-doped polysilicon layer 9.

In some embodiments, the passivation and anti-reflection layer 13 is a silicon nitride layer. The first electrode 14 and the second electrode 15 are metal gate electrodes.

The present application will be further described below in conjunction with specific examples and comparative examples, which should not be construed as limiting the protection scope of the present application.

EXAMPLE 1

A method for preparing an-type full back contact solar cell 100 includes the following steps.

An n-type silicon substrate 1 is provided, followed by performing a damage removal treatment on the n-type silicon substrate 1 with an alkaline solution of sodium hydroxide (NaOH) and then a cleaning treatment.

A first silicon oxide layer 2 with a thickness of 1 nm and an intrinsic amorphous silicon layer 3 with a thickness of 200 nm are sequentially deposited on the back surface of the n-type silicon substrate 1 through LPCVD.

A phosphosilicate glass layer 4 (PSG) and a second silicon oxide layer 5 are sequentially deposited on the intrinsic amorphous silicon layer 3 by APCVD. In which, a thickness of the phosphosilicate glass layer 4 is 50 nm, a mass percent of phosphorus (P) in the phosphosilicate glass layer 4 is 30%, and a thickness of the second silicon oxide layer 5 is 50 nm.

A corrosion-resistant slurry, which is a waxy resin material and is characterized by acid resistance and no alkali resistance, is printed in a partial region of the second silicon oxide layer 5 on the back surface of the n-type silicon substrate 1, and dried to form a patterned blocking layer 6 having printed lines with spacing of 1200 μm.

The phosphosilicate glass layer 4 and the second silicon oxide layer 5 in the region where the patterned blocking layer 6 is not formed are removed with a HF solution. The patterned blocking layer 6 is then removed with a mixed solution of NaOH and $H_2O_2$. Next, a mixed solution of HCl and $H_2O_2$ is used for cleaning.

The above n-type silicon substrate 1 is placed in a boron diffusion furnace. By using $BCl_3$ as a boron source (with a volume proportion of 20% in the atmosphere), the back surface of the n-type silicon substrate 1 is subjected to boron diffusion at a temperature of 980° C. for 2 h to form p-type B-doped polysilicon (i.e., boron-doped polysilicon layer 7). Due to the diffusion, borosilicate glass (BSG) is formed in the outer layer of the boron-doped polysilicon layer 7. In the region where the phosphosilicate glass layer 4 and the second silicon oxide layer 5 are retained, the phosphorus in the phosphosilicate glass layer 4 is pushed into the intrinsic amorphous silicon layer 3 due to the action of the high temperature, to form n-type P-doped polysilicon (i.e., phosphorus-doped polysilicon layer 9); and boron will not be doped into the intrinsic amorphous silicon layer 3 due to the blocking of the outer second silicon oxide layer 5 in this region.

A laser is used to ablate the boundary between the p-region (i.e., a region having the boron-doped polysilicon layer 7) and the n-region (i.e., a region having the phosphorus-doped polysilicon layer 9), and then the junction is etched using a NaOH solution to form an isolation groove 10 that separates the boron-doped polysilicon layer 7 from the phosphorus-doped polysilicon layer 9.

A chain acid polishing (HF+HNO₃) device is used to remove silicon oxide, phosphosilicate glass, polysilicon and borosilicate glass wrapped around on the front surface of the n-type silicon substrate 1. Next, the n-type silicon substrate 1 is sent to a slot cleaning machine, and a NaOH solution is utilized to texturize the front surface of the n-type silicon substrate 1, during which the back surface is not etched by the alkaline solution due to the protection of the phosphosilicate glass layer 4 and the borosilicate glass layer. Then, a mixed solution of HF and HCl is utilized for cleaning.

Aluminum oxide layers 12 (AlOx) with a thickness of 5 nm are respectively formed on the front surface and the back surface of the n-type silicon substrate 1 through ALD.

A passivation and anti-reflection layer 13 with a thickness of 75 nm is deposited on the front surface of the n-type silicon substrate 1 and a passivation and anti-reflection layer 13 with a thickness of 100 nm is deposited on the back surface of the n-type silicon substrate 1 through tubular PECVD.

A laser is utilized to form openings in the passivation and anti-reflection layer 13 on the back surface of the n-type silicon substrate 1, to form a first electrode contact hole which is communicated with the boron-doped polysilicon layer 7 and a second electrode contact hole which is communicated with the phosphorus-doped polysilicon layer 9, respectively.

A first electrode 14 is formed at the first electrode contact hole and a second electrode 15 is formed at the second electrode contact hole by screen printing. The first electrode 14 is connected to the boron-doped polysilicon layer 7, and the second electrode 15 is connected to the phosphorus-doped polysilicon layer 9.

Light is injected into the prepared solar cell 100 to obtain the n-type full back contact solar cell 100.

EXAMPLE 2

The method for preparing the solar cell 100 in this example is basically the same as that in Example 1, except that the first silicon oxide layer 2 and the intrinsic amorphous silicon layer 3 are sequentially formed on the back surface of the n-type silicon substrate I through the PECVD method. By using this preparation method, the wrap-around layer 11 formed on the front surface of the n-type silicon substrate 1 is less and is easier to remove, which is beneficial to improving the appearance and yield of the solar cell 100.

EXAMPLE 3

The method for preparing the solar cell 100 in this example is basically the same as that in Example 1, except that the mass percent of phosphorus (P) in the phosphosilicate glass layer 4 deposited on the intrinsic amorphous silicon layer 3 by APCVD in this example is reduced to 20% from 30% in Example 1.

That is, the doping concentration of the n-region of the solar cell 100 prepared in this example is reduced, and thus the concentration of phosphorus in the phosphorus-doped polysilicon layer 9 is reduced, which reduces the carrier recombination in the n-region, thereby improving the passivation performance of the n-region.

EXAMPLE 4

The method for preparing the solar cell 100 in this example is basically the same as that in Example 1, except that after forming the isolation groove 10, a third silicon oxide layer with a thickness of 50 nm to 200 nm is deposited in the isolation groove 10 by APCVD, and then the chain acid polishing to remove the wrap-around layer in step 8 and texturing are performed.

In the preparation method of this example, by depositing the third silicon oxide layer in the isolation groove 10, the laser grooved region on the back surface of the n-type silicon substrate 1 can be protected from being textured, which maintains the morphology of the polished surface on the back surface of the n-type silicon substrate and reduces the carrier recombination in this region, thereby improving the overall passivation performance of the back surface of the n-type silicon substrate 1.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A method for preparing a solar cell, comprising the following steps of:

forming a first silicon oxide layer, an intrinsic amorphous silicon layer, a phosphosilicate glass layer, and a second silicon oxide layer sequentially on a back surface of an n-type silicon substrate;

removing the phosphosilicate glass layer and the second silicon oxide layer on a partial region of the back surface of the n-type silicon substrate;

performing boron diffusion on the back surface of the n-type silicon substrate, so that the intrinsic amorphous silicon layer in a region where the phosphosilicate glass layer and the second silicon oxide layer are removed is converted into a boron-doped polysilicon layer, and the intrinsic amorphous silicon layer in a region where the phosphosilicate glass layer and the second silicon oxide layer are not removed is converted into a phosphorus-doped polysilicon layer;

forming an isolation groove at a boundary between the boron-doped polysilicon layer and the phosphorus-doped polysilicon layer; and preparing a first electrode connected to the boron-doped polysilicon layer and a second electrode connected to the phosphorus-doped polysilicon layer.

2. The method for preparing the solar cell according to claim 1, wherein performing boron diffusion on the back surface of the n-type silicon substrate comprises the following step of:

performing a diffusion treatment on the back surface of the n-type silicon substrate using a boron source at a temperature ranging from 900° C. to 1050° C. for 1 h to 3 h.

3. The method for preparing the solar cell according to claim 2, wherein the boron source is one or more selected from BCl₃ or BBr₃.

4. The method for preparing the solar cell according to claim 2, wherein a volume proportion of the boron source in an atmosphere of the boron diffusion is 5% to 30%.

5. The method for preparing the solar cell according to claim 1, wherein removing the phosphosilicate glass layer and the second silicon oxide layer in the partial region of the back surface of the n-type silicon substrate comprises the following steps of:

forming a patterned blocking layer in a partial region of a surface of the second silicon oxide layer;

removing the phosphosilicate glass layer and the second silicon oxide layer in a region of the back surface of the n-type silicon substrate where the patterned blocking layer is not formed using a solution containing hydrogen fluoride; and removing the patterned blocking layer.

6. The method for preparing the solar cell according to claim 5, wherein the patterned blocking layer is a waxy resin material.

7. The method for preparing the solar cell according to claim 5, wherein the patterned blocking layer is removed using an alkali solution containing hydrogen peroxide.

8. The method for preparing the solar cell according to claim 5, wherein forming the isolation groove at the boundary between the boron-doped polysilicon layer and the phosphorus-doped polysilicon layer comprises the following step of:

performing laser grooving at the boundary between the boron-doped polysilicon layer and the phosphorus-doped polysilicon layer, and etching a laser-formed groove using an alkali solution.

9. The method for preparing the solar cell according to claim 1, wherein after forming the isolation groove and prior to preparing the first electrode and the second electrode, the method further comprises a step of removing a wrap-around layer on a front surface of the n-type silicon substrate.

10. The method for preparing the solar cell according to claim 9, wherein after forming the isolation groove and prior to removing the wrap-around layer on the front surface of the n-type silicon substrate, the method further comprises a step of forming a third silicon oxide layer in the isolation groove.

11. The method for preparing the solar cell according to claim 9, wherein after removing the wrap-around layer on the front surface of the n-type silicon substrate and prior to preparing the first electrode and the second electrode, the method further comprises a step of performing a texturing process on the front surface of the n-type silicon substrate, and cleaning the n-type silicon substrate using a mixed solution of hydrofluoric acid and hydrochloric acid.

12. The method for preparing the solar cell according to claim 11, wherein after cleaning the n-type silicon substrate and prior to preparing the first electrode and the second electrode, the method further comprises a step of forming aluminum oxide layers on the front surface and the back surface of the n-type silicon substrate, respectively.

13. The method for preparing the solar cell according to claim 12, wherein after forming the aluminum oxide layers and prior to preparing the first electrode and the second electrode, the method further comprises a step of forming passivation and anti-reflection layers on the aluminum oxide layers on the front surface and the back surface of the n-type silicon substrate, respectively.

14. The method for preparing the solar cell according to claim 13, wherein after forming the passivation and anti-reflection layer and prior to preparing the first electrode and the second electrode, the method further comprises forming openings in the passivation and anti-reflection layer on the back surface of the n-type silicon substrate, and form a first electrode contact hole in communication with the boron-doped polysilicon layer and a second electrode contact hole in communication with the phosphorus-doped polysilicon layer.

15. The method for preparing the solar cell according to claim 14, wherein the first electrode is prepared in the first electrode contact hole by screen printing; and the second electrode is prepared in the second electrode contact hole by screen printing.

* * * * *